United States Patent
Gilliland et al.

(10) Patent No.: US 8,910,706 B2
(45) Date of Patent: Dec. 16, 2014

(54) HEAT SINK APPARATUS WITH EXTENDABLE PIN FINS

(75) Inventors: Don Alan Gilliland, Rochester, MN (US); Maurice Francis Holahan, Lake City, MN (US); Cary Michael Huettner, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 914 days.

(21) Appl. No.: 12/365,998

(22) Filed: Feb. 5, 2009

(65) Prior Publication Data

US 2010/0193175 A1    Aug. 5, 2010

(51) Int. Cl.
| | |
|---|---|
| F28F 27/00 | (2006.01) |
| F28D 15/00 | (2006.01) |
| F28F 1/08 | (2006.01) |
| F28F 23/00 | (2006.01) |
| H01L 23/427 | (2006.01) |
| F28D 21/00 | (2006.01) |

(52) U.S. Cl.
CPC ........... F28F 1/08 (2013.01); *F28D 2021/0029* (2013.01); *F28F 2215/06* (2013.01); *F28F 2215/14* (2013.01); F28F 23/00 (2013.01); H01L 23/427 (2013.01); *F28F 2255/02* (2013.01)
USPC ............. 165/276; 165/104.22; 165/104.27; 165/104.28; 165/104.31; 165/104.33; 165/272

(58) Field of Classification Search
USPC ............... 165/80.2, 80.3, 81–83, 86, 104.22, 165/104.25, 104.27, 104.28, 104.31, 165/104.33, 276, 287, 272
See application file for complete search history.

(56) References Cited

U.S. PATENT DOCUMENTS

| | | | | | |
|---|---|---|---|---|---|
| 3,402,761 | A | * | 9/1968 | Swet | 165/272 |
| 4,051,890 | A | * | 10/1977 | Melchior | 165/276 |
| 4,145,708 | A | * | 3/1979 | Ferro et al. | 257/715 |
| 4,323,914 | A | * | 4/1982 | Berndlmaier et al. | 257/713 |
| 4,488,592 | A | * | 12/1984 | Mittal et al. | 165/104.31 |
| 4,813,476 | A | * | 3/1989 | Mahefkey | 165/272 |
| 4,951,740 | A | * | 8/1990 | Peterson et al. | 165/276 |
| 5,006,924 | A | * | 4/1991 | Frankeny et al. | 257/714 |
| 5,166,863 | A | * | 11/1992 | Shmunis | 361/699 |
| 5,198,889 | A | * | 3/1993 | Hisano et al. | 257/678 |
| 5,253,702 | A | * | 10/1993 | Davidson et al. | 165/80.4 |

(Continued)

FOREIGN PATENT DOCUMENTS

| | | |
|---|---|---|
| CN | 2376002 Y | 4/2000 |
| CN | 2664194 Y | 12/2004 |
| JP | 59158987 A * | 9/1984 |

*Primary Examiner* — Allana Lewin
*Assistant Examiner* — Travis Ruby
(74) *Attorney, Agent, or Firm* — Toler Law Group (57) ABSTRACT

An apparatus for cooling a heat-generating component is disclosed. The apparatus includes a cooling chamber containing a liquid metal. The cooling chamber has a heat-conducting wall thermally coupled to the heat-generating component. A plurality of extendable tubes making up an array of cooling pin fins is attached to the cooling chamber. Each of the extendable tubes has a port end that opens into the cooling chamber and a sealed end that projects away from the cooling chamber. Moreover, each of the extendable tubes has an extended position when filled with liquid metal from the cooling chamber and a retracted position when emptied of the liquid metal. A pump system is included for urging the liquid metal from the cooling chamber into the plurality of extendable tubes.

26 Claims, 7 Drawing Sheets

(56) References Cited

U.S. PATENT DOCUMENTS

| | | | |
|---|---|---|---|
| 5,309,318 A | 5/1994 | Beilstein et al. | |
| 5,386,143 A | 1/1995 | Fitch | |
| 5,411,077 A * | 5/1995 | Tousignant | 165/104.33 |
| 5,911,272 A * | 6/1999 | Cornog et al. | 165/104.25 |
| 6,019,165 A | 2/2000 | Batchelder | |
| 6,062,299 A * | 5/2000 | Choo et al. | 165/46 |
| 6,504,720 B2 | 1/2003 | Furuya | |
| 6,675,887 B2 * | 1/2004 | Garner et al. | 165/274 |
| 6,708,501 B1 | 3/2004 | Ghoshal et al. | |
| 7,019,973 B2 * | 3/2006 | Rivera | 361/700 |
| 7,042,240 B2 * | 5/2006 | Lopez et al. | 324/750.07 |
| 7,106,589 B2 * | 9/2006 | Kiley et al. | 361/700 |
| 7,143,820 B2 | 12/2006 | Crocker et al. | |
| 7,327,570 B2 | 2/2008 | Belady | |
| 7,379,301 B2 | 5/2008 | Liu et al. | |
| 7,408,778 B2 | 8/2008 | Gilliland | |
| 2004/0035556 A1 * | 2/2004 | Jean | 165/86 |
| 2006/0094347 A1 * | 5/2006 | Tracy et al. | 454/184 |
| 2006/0213645 A1 | 9/2006 | Wintersteen et al. | |
| 2007/0008702 A1 * | 1/2007 | Chang et al. | 361/704 |
| 2007/0169928 A1 * | 7/2007 | Dayan et al. | 165/287 |
| 2008/0043437 A1 * | 2/2008 | Refai-Ahmed | 361/700 |

* cited by examiner

HEAT SINK APPARATUS WITH EXTENDABLE PIN FINS

FIELD OF THE INVENTION

The present invention relates to cooling heat-producing devices. In particular, the present invention pertains to electronic systems that use pin-fin type heat sinks to remove heat from electronic devices such as high-speed microprocessors.

BACKGROUND OF THE INVENTION

Efficient cooling of integrated circuits (IC) devices is essential to prevent failure due to excessive heating. Cooling demands continue to grow as the number of complimentary metal oxide semiconductor (CMOS) devices per chip and clock speeds increases, such efficient cooling has become an even more prominent concern. For example, while the current generation of microprocessors generates heat on the order of 100 W/cm2, the next generation of computer microprocessors is expected to reach heat generation levels of 200 W/cm2 or more.

IC chips are conventionally cooled by a heat exchange mechanism, or heat sink, having a thermally conductive plate coupled to the chip. The plate typically has a plurality of raised fins or pin fins extending from one of its surfaces. The pin fins increase the surface area over which air may flow, thereby increasing the rate of heat transfer from the heat sink to the surrounding air.

Such air-cooled methods have generally proven to be reliable in facilitating heat transfer for current chips. However, it is generally concluded that current methods of forced air-cooling have reached their limits of performance. Moreover, conventional heat sinks are currently designed to have set dimensions and are not adaptable to differing environmental conditions. As such, the trend towards smaller, more powerful chips that generate even greater amounts of heat makes continued reliance on conventional air cooled methods inadequate.

Thus, there is a need for a heat exchange apparatus that is capable of providing a heat sink that is dimensionally adaptable to differing environmental conditions.

SUMMARY OF THE INVENTION

The present invention provides an improved computer implemented apparatus, and method for cooling a heat-generating component in a changing environment. Embodiments of the present invention improve cooling efficiency by providing an apparatus comprising a heat-generating component, a heat sink with a cooling chamber containing a cooling fluid, the cooling chamber having a heat conducting wall thermally coupled to the heat-generating component, and a plurality of extendable tubes attached to the heat sink. Each tube may have a port end that opens into the cooling chamber and a sealed end that projects away from the cooling chamber. The extendable tubes may have an extended position when filled with the cooling fluid and a retracted position when emptied of the cooling fluid. The cooling fluid may be liquid metal.

Aspects of the invention may further include a pump system for urging the cooling fluid from the cooling chamber into the plurality of extendable tubes. The electronic pump control system may be interfaced with at least one temperature sensor that monitors the temperature of the heat-generating component. At least one temperature sensor may be embedded in the heat conducting wall thermally coupled to the heat-generating component. The electronic pump control system may also include a micro-controller for activating the pump system to urge cooling fluid into the plurality of extendable tubes to force them into their extended position when the temperature sensor reports a temperature measurement above a predetermined threshold. The micro-controller may be embedded in the heat sink.

Embodiments of the invention may include at least one baffle dividing the cooling chamber into compartments. The cooling fluid may be selectively directed into predetermined groups of the plurality of extendable tubes. Each of the extendable tubes may include a section adapted to carry radial cooling fins. Each tube may comprise a bellows having a longitudinal axis along which the bellows extends when filled with the cooling fluid and retracts when emptied of the cooling fluid. The bellows may be cylindrical.

The pump system of an embodiment may include at least one solenoid pump comprising a coil winding over a tubular liner that defines a solenoid core volume, and a core plunger made of magnetic material. The core plunger may have a coil winding energized position substantially inside the solenoid core, thereby taking up the solenoid core volume. The core plunger may also have a coil winding de-energized position substantially outside the solenoid core volume. The tubular liner may be made of a material that is resistant to damage from both the temperature and the composition of the cooling fluid. The solenoid pump core volume may be dimensioned to include a volume of cooling fluid equal to the amount of cooling fluid needed to maintain the extendable tubes into their extended position when the coil winding is energized and the plunger takes up the solenoid core volume.

Another embodiment of the invention may comprise a heat-generating component, a heat sink with a cooling chamber containing a liquid metal. The cooling chamber may have a heat conducting wall thermally coupled to the heat-generating component, and a plurality of extendable tubes attached to the heat sink. Each of the tubes may have a port end that opens into the cooling chamber and a sealed end that projects away from the cooling chamber. Each of the extendable tubes may also have an extended position when filled with liquid metal from the cooling chamber and a retracted position when emptied of the liquid metal, and a pump system for urging the liquid metal from the cooling chamber into the plurality of extendable tubes.

The apparatus may further include an electronic pump control system interfaced with at least one temperature sensor embedded in the heat conducting wall thermally coupled to the heat-generating component. The electronic pump control system may also include a micro-controller embedded in the heat sink for activating the pump system to urge the liquid metal into the plurality of extendable tubes to force them into their extended position when the at least one temperature sensor reports at least one temperature measurement above a predetermined threshold.

Embodiments may further include at least one baffle dividing the cooling chamber into compartments such that the liquid metal may be selectively directed into predetermined groups of the plurality of extendable tubes. The extendable tubes may comprise a bellows having a longitudinal axis along which the bellows extends when filled with the liquid metal and retracts when emptied of the liquid metal. The extendable tubes may include a section adapted to carry radial cooling fins.

Aspects of the pump system may also include at least one solenoid pump comprising a coil winding over a tubular liner that defines a solenoid core volume, and a core plunger made of magnetic material. The core plunger may have a coil winding energized position substantially inside the solenoid core, thereby taking up the solenoid core volume and a coil winding de-energized position substantially outside the solenoid core volume. The tubular liner may be made of a material that is resistant to damage from both temperature and the composition of the liquid metal. The solenoid pump core volume may be dimensioned to contain a volume of liquid metal equal to the amount of liquid metal needed to maintain the extendable tubes into their extended position when the coil winding is energized and the plunger takes up the solenoid core volume.

Embodiments of the invention also include a method of cooling a heat-generating component, the method comprising steps of providing a heat sink having a cooling chamber containing a cooling fluid. The cooling chamber may have a heat conducting wall thermally coupled to the heat-generating component, providing a plurality of extendable tubes attached to the heat sink. Each of the tubes may have a port end that opens into the cooling chamber and a sealed end that projects away from the cooling chamber. Each of the extendable tubes may also have an extended position when filled with the cooling fluid and a retracted position when emptied of the cooling fluid, providing a pump system for urging the cooling fluid from the cooling chamber into the plurality of extendable tubes. The pump system may include an electronic pump control system interfaced with at least one temperature sensor that monitors the temperature of the heat-generating component, and pumping the cooling fluid from the cooling chamber into the extendable tubes when the at least one temperature sensor reports a temperature that is greater than a predetermined temperature threshold.

Another aspect of the invention may comprise a heat-generating component, a heat sink with a cooling chamber containing a liquid metal. The cooling chamber may have a heat conducting wall thermally coupled to the heat-generating component, and a plurality of extendable tubes attached to the heat sink. Each of the tubes may have a port end that opens into the cooling chamber and a sealed end that projects away from the cooling chamber. Each of the extendable tubes may also have an extended position when filled with liquid metal from the cooling chamber and a retracted position when emptied of the liquid metal, a pump system for urging the liquid metal from said cooling chamber into the plurality of extendable tubes, and an electronic pump control system that includes a micro-controller in communication with at least one temperature sensor for activating the pump system. The pump system may urge the liquid metal into the plurality of extendable tubes to force them into their extended position when the at least one temperature sensor reports at least one temperature measurement above a predetermined threshold.

These and other advantages and features that characterize the invention are set forth in the claims annexed hereto and forming a further part hereof. However, for a better understanding of the invention, and of the advantages and objectives attained through its use, reference should be made to the Drawings and to the accompanying descriptive matter in which there are described exemplary embodiments of the invention.

DETAILED DESCRIPTION

Embodiments consistent with the present invention include a method and apparatus for cooling a semiconductor heat source. Generally, aspects of the invention include a heat sink having an array of extendable pin fins that can adapt to changing environmental conditions. The function is that of an inter-leaving heat sink filled with a liquid metal.

Specifically, the heat sink's pin fins may extend taller or retract shorter based upon an environmental feedback from temperature sensors, such as thermocouples that sense the temperature of the semiconductor device or other heat-generating component being cooled. Associated circuitry such as digital logic, and a micro-controller programmed with software and/or firmware for controlling the pin fin extension and retraction process is embedded in the heat sink.

The heat sink includes a cooling chamber that includes a cooling fluid such as a liquid metal. A heat conducting wall of the cooling chamber may be thermally coupled to the cooling chamber. A plurality of extendable tubes makes up the array of extendable pin fins. Each of the extendable tubes has a port end that opens into the cooling chamber and a sealed end that projects away from the cooling chamber. Each of the extendable tubes (i.e., pin fins) may have an extended position when filled with the cooling fluid and a retracted position when emptied of the cooling fluid. A pump system for urging the cooling fluid from the cooling chamber and into the plurality of extendable tubes may also be included. Moreover, excellent heat conduction is realizable if the cooling fluid is a liquid metal, as is called for in one embodiment of the invention. Any number of heat sinks can be controlled individually or controlled at a system level to include feedback for air moving devices such as fans, and other environmental conditions inside and/or outside a server/computer.

While embodiments of the invention are illustrated with respect to a semiconductor microprocessor as a heat-generating component, it should be understood that embodiments of the invention may be used to cool other types of semiconductor chips and electronic or electrical devices, as well as any other heat-generating component or device. Similarly, an embodiment of the invention is illustrated having a cooling fluid and fluid pumps, but the invention may also be practiced with other well known cooling devices such as a fan to move air as an additional cooling fluid over the heat sink.

Figure 1:
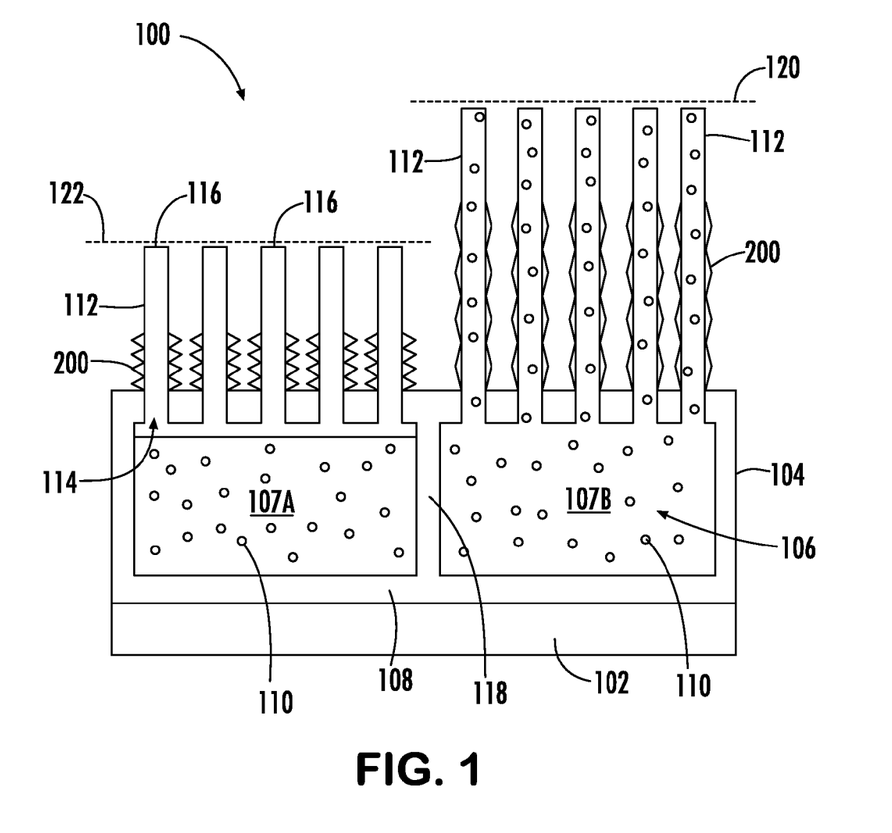
FIG. 1 is a side cross-sectional view of the heat sink apparatus according to one embodiment of the invention.

FIG. 1 shows a cross-sectional view of the apparatus consistent with embodiments of the present invention. The apparatus 100 generally includes a heat-generating component 102 and a heat sink 104 with a cooling chamber 106 having a heat conducting wall 108 thermally coupled to heat-generating component 102. Cooling chamber 106 is for containing a cooling fluid 110 such as a liquid metal. Liquid metals have a high thermal conductivity that allows for efficient thermal coupling to heat-generating component 102. For example, cooling fluid 110 may comprise at least one of: gallium, indium, tin, bismuth, sodium, and potassium. The cooling fluid 110 may be in a liquid state over the desired range of operating temperatures of apparatus 100. Cooling fluid 110 may also comprise a gallium tin alloy, (e.g., a gallium indium tin eutectic).

The heat conduction wall 108 may be coupled to the heat-generating component 102 by adhesive or by mechanical joining such as by screwing, bolting, clamping, and the like, and in a manner suitable to prevent leakage of the cooling fluid 110 from the cooling chamber 106. In one embodiment, the heat sink 104 and heat-conducting wall 108 may be made of copper or aluminum.

Optionally, a coating (not shown) may be disposed on the inner surfaces of cooling chamber 106. The coating may improve compatibility between the cooling fluid 110 and the materials comprising the inner surfaces of cooling chamber 106. The coating may be selected to enhance the adhesion of the heat conducting wall 108 to the heat-generating component 102. The coating may also be selected to act as an oxidation prevention outer layer, or to enhance the wettability of the cooling fluid 110 with respect to the cooling chamber's inner surfaces. It is contemplated that multiple coatings may be provided. For example, a first coating may protect the inner surfaces of cooling chamber 106 from the cooling fluid 110, and a second coating may enhance the wettability of the cooling fluid over the inner surfaces of the cooling chamber 106.

The coatings may be applied by any conventional means, such as by evaporation, sputtering, plating, chemical vapor deposition, and the like. The thickness of the coating or coatings is chosen for robustness in the presence of the cooling fluid 110, and generally will depend upon the material comprising the coating, the method of application, and the coverage required to achieve the intended purpose of the coating. In one embodiment where the cooling fluid 110 comprises a liquid metal, the coating may comprise of chromium, gold, molybdenum, nickel, platinum, tantalum, titanium, and tungsten. In another embodiment, a chromium coating is disposed on the cooling chamber 106 and has a coating of either gold or platinum disposed on top of the chromium. The chromium coating may be formed to a thickness of about 2500 angstroms. The gold or platinum coating may be formed to a thickness of about 300 angstroms. Optionally, a coating of titanium 500 angstroms thick, for example, may be formed on the inner surfaces of cooling chamber 106 in place of or on top of the layer of chromium.

Figure 6:
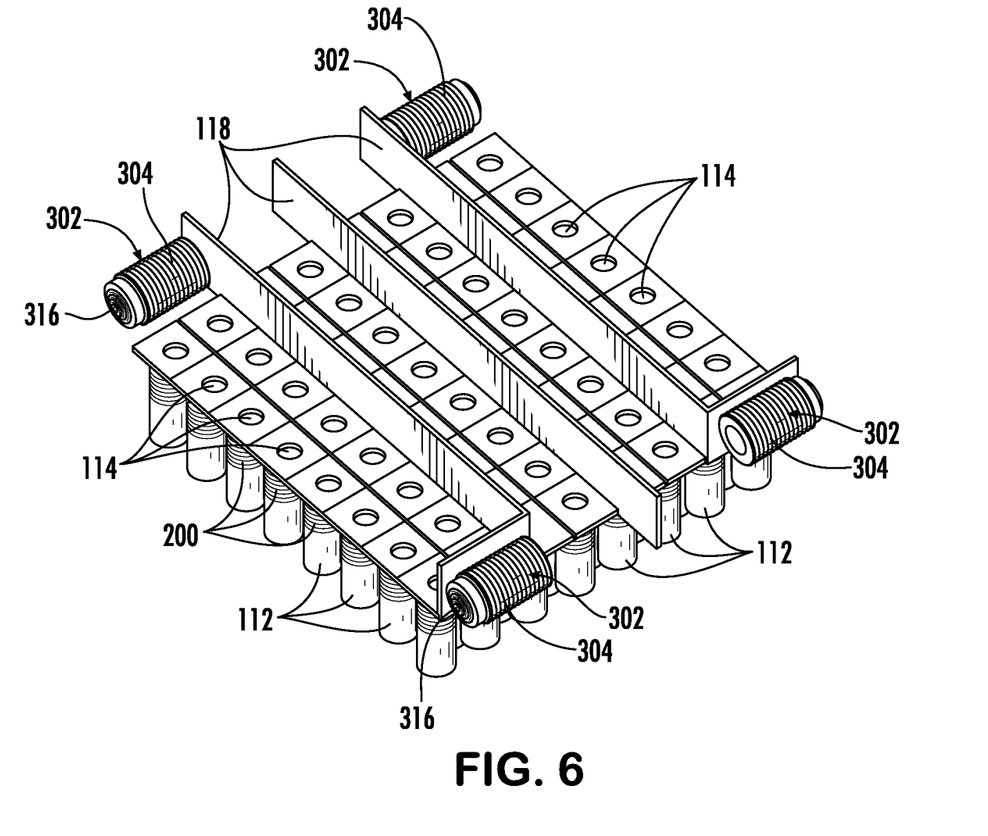
FIG. 6 is an upside down perspective view of a baffle structure with attached solenoid pumps according to one embodiment of the invention.
Figure 9:
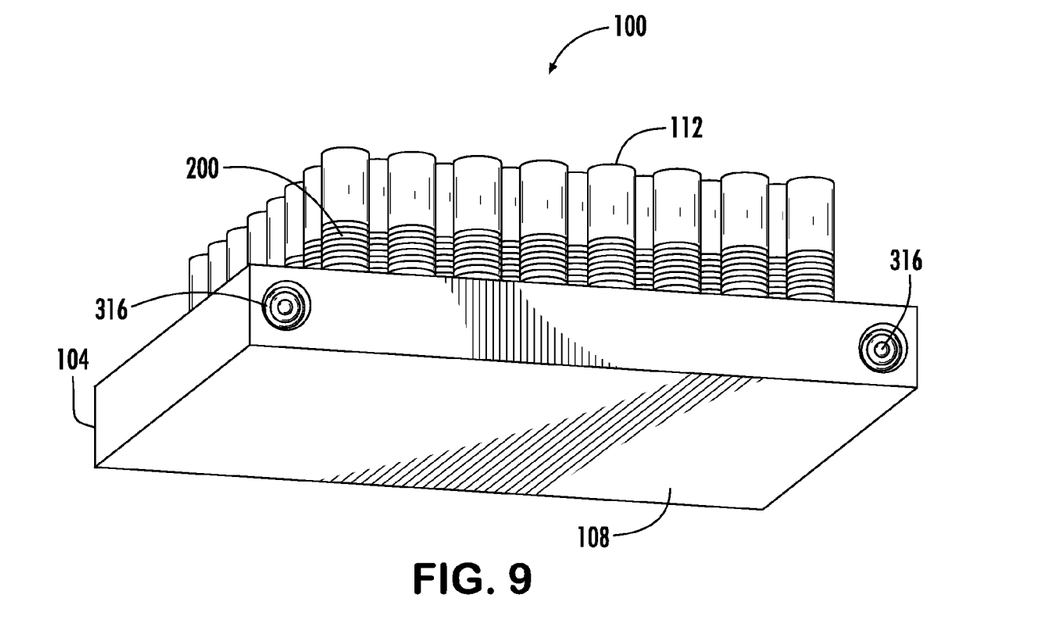
FIG. 9 shows an external perspective view of an assembled embodiment of the present invention.

As shown in FIGS. 1, 6 and 9, a plurality of extendable tubes 112 making up a pin fin array is attached to heat sink 104. Each of extendable tubes 112 have a port end 114 that opens into cooling chamber 106, and a sealed end 116 that projects away from cooling chamber 106. Moreover, as shown in FIG. 1 each of extendable tubes 112 have an extended position 120 when filled with cooling fluid 110 and a retracted position 122 when emptied of cooling fluid 110. Also, as depicted in FIGS. 1 and 6, cooling chamber 106, may further include at least one baffle 118 that divides cooling chamber 106 into compartments 107A and 107B such that cooling fluid 110 may be selectively directed into predetermined groups of the plurality of extendable tubes 112.

Figure 2:
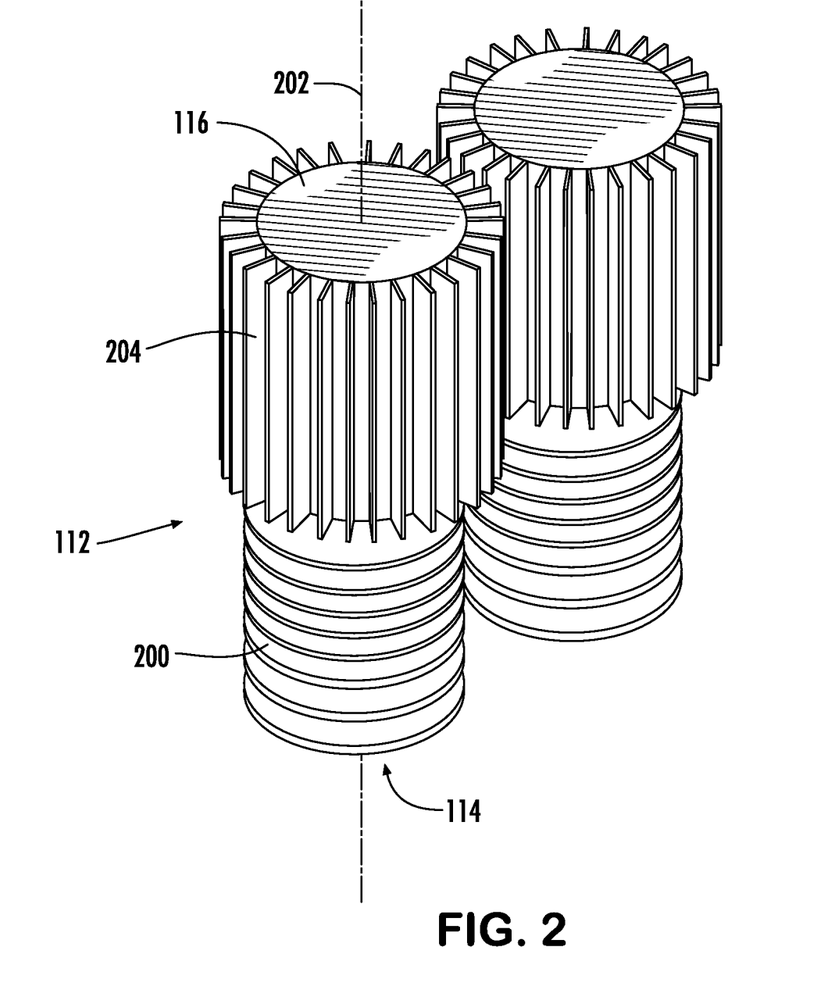
FIG. 2 is a perspective view of an extendable tube with a section adapted to carry a micro-fin radiator.

As best seen in FIGS. 1 and 2, each of the extendable tubes 112 may comprise a bellows 200. Each bellows 200 may extend along a longitudinal axis 202 when filled with cooling fluid 110. Each bellows 200 may retract when emptied of cooling fluid 110. The bellows 200 may be cylindrical, but it could also be other volume containing shapes depending on practicality and other engineering factors such as thermal radiation ability, etc. Moreover, the extendable tubes 112 may also include a section adapted to carry radial cooling fins 204. As shown in FIG. 2, the sealed ends 116 of the extendable tubes 112 may be adapted to carry radial cooling fins 204, which may be micro fins.

Figure 3:
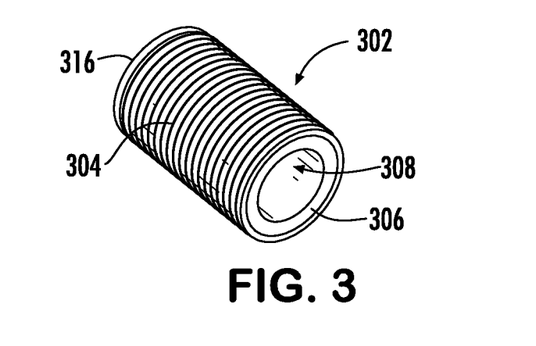
FIG. 3 is a perspective view of a solenoid pump winding on a tubular core that has an open solenoid core volume.
Figure 4:
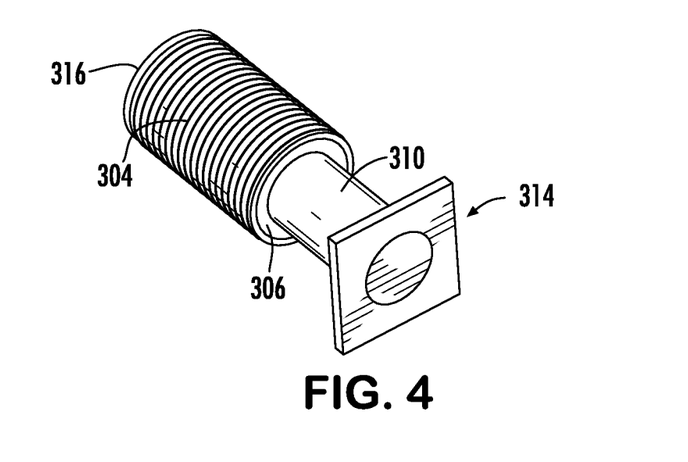
FIG. 4 is a perspective view of the solenoid pump with a core plunger in the solenoid de-energized position.
Figure 5:
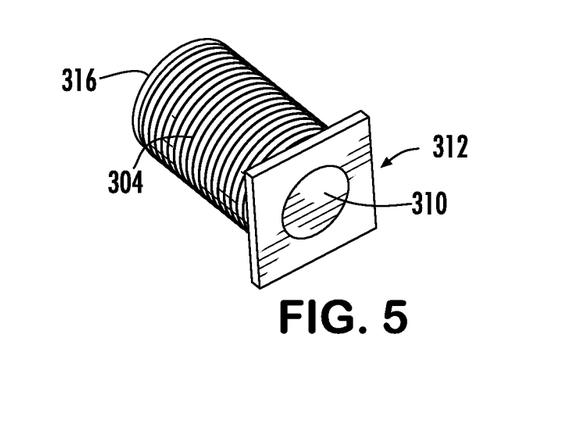
FIG. 5 is a perspective view of the solenoid pump with the core plunger in the solenoid energized position.

Turning now to FIGS. 3-5, a pump system 300 may be included for urging cooling fluid 110 from cooling chamber 106 and into the plurality of extendable tubes 112. In one embodiment, the pump system 300 includes at least one solenoid pump 302 having a coil winding 304 over a tubular liner 306 that defines a solenoid core volume 308. The tubular liner is made of a material such as ceramic or plastic that is resistant to damage from both the temperature and chemical composition of cooling fluid 110.

As shown in FIG. 4, solenoid pump 302 also includes a core plunger 310 made of a magnetic material such as steel. Core plunger 310 is sized such that it substantially takes up the solenoid core volume 308 when the core plunger 310 is pulled inside the solenoid core volume 308 when coil winding 304 is energized with electrical current that generates a magnetic field.

FIG. 5 shows core plunger 310 in a coil winding energized position 312 that is substantially inside the solenoid core, thereby taking up the solenoid core volume, and a coil winding de-energized position 314 substantially outside the solenoid core volume. Moreover, the solenoid core volume 308 may be dimensioned to include a volume of cooling fluid 110 that is equal to the amount of cooling fluid 110 needed to maintain the extendable tubes into their extended position when the coil winding 304 is energized, which results in the core plunger 310 substantially taking up the solenoid core volume 308. Preferably, the solenoid tubular liner 306 includes a flexible containment seal 316 for preventing leakage of the cooling fluid 110 during an inward core stroke of the core plunger 310.

Figure 7:
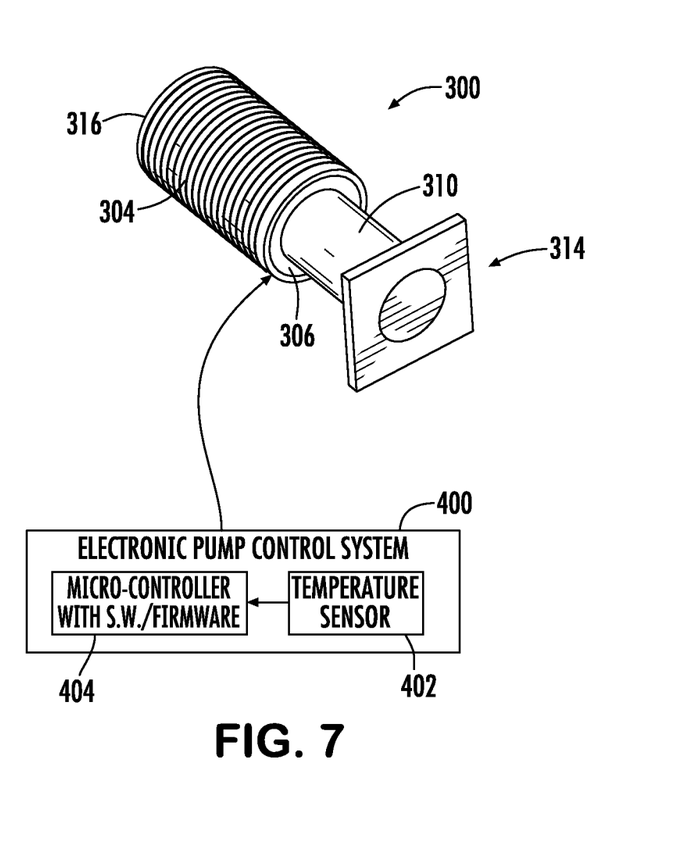
FIG. 7 shows an electronic pump control system in communication with a solenoid pump.

FIG. 7 depicts an electronic pump control system 400 that may be interfaced with at least one temperature sensor 402 that monitors the temperature of heat-generating component 102. At least one temperature sensor 402 may be a thermocouple type temperature sensor embedded in heat sink 104 and preferably embedded into the heat conducting wall 108 thermally coupled to the heat-generating component 102. Electronic pump control system 400 may include a microcontroller 404 programmed with software and/or firmware for activating pump system 300 to urge cooling fluid into the plurality of extendable tubes to force them into their extended position when the at least one temperature sensor reports at least one temperature above a predetermined threshold.

At least one solenoid pump 302 may be associated with each of the compartments 107A and 107B shown in FIG. 1. In this way, the solenoid pump 302 in fluidic communication with one of compartments 107A or 107B may be individually energized to extend one of the predetermined groups of extendable tubes 112 into their extended position 120 while leaving other predetermined groups of extendable tubes 112 in their retracted position 122.

Figure 8:
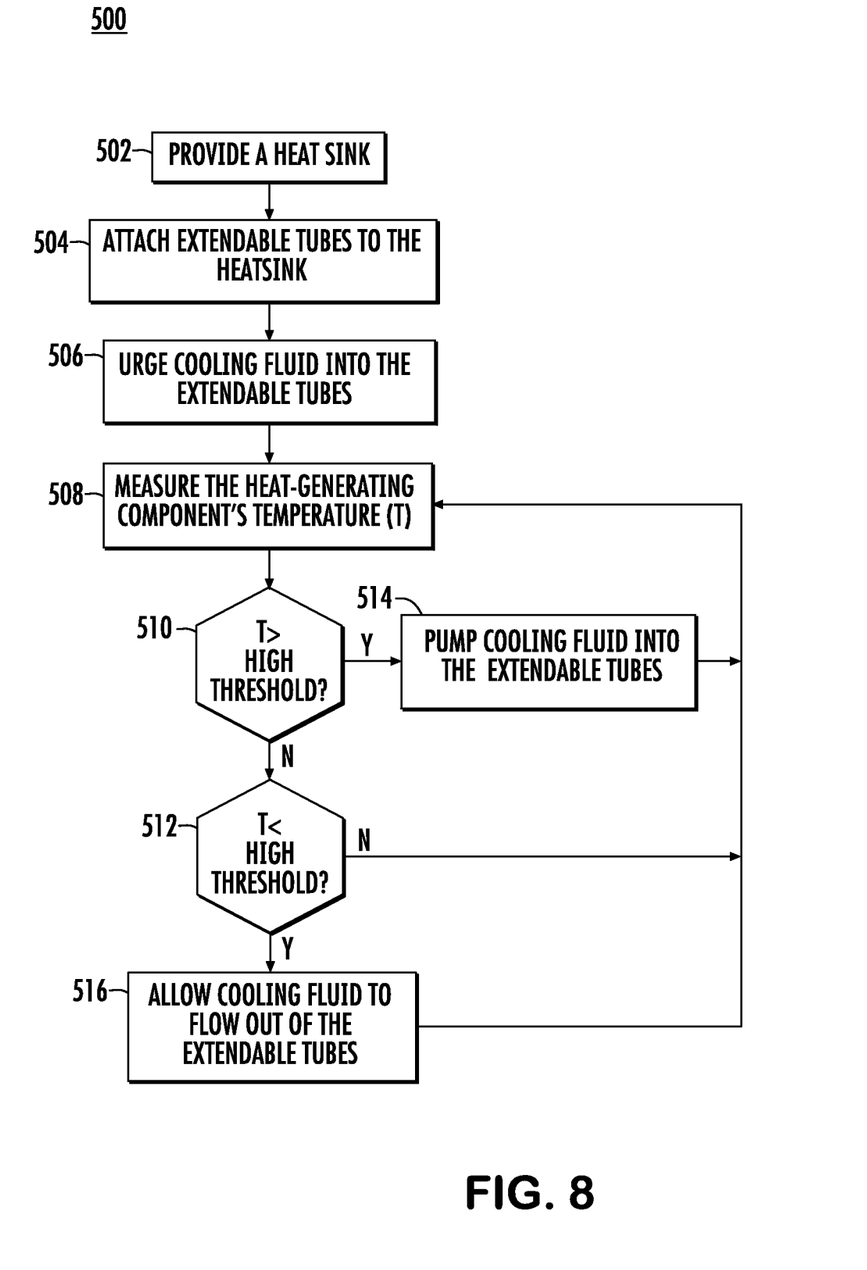
FIG. 8 shows a flowchart having method steps used to realize and operate an embodiment of the present invention.

Turning now to FIG. 8, embodiments consistent with the present invention also include a method 500 of cooling the heat-generating component 102. Step 502 provides heat sink 104 having the cooling chamber 106 containing the cooling fluid 110, wherein the heat conducting wall 108 may be thermally coupled to the heat-generating component 102.

At step 504, the pump system 300 provides a plurality of extendable tubes attached to the heat sink 104. Each of the extendable tubes 112 may include a port end 114 that opens into the cooling chamber 106 and a sealed end 116 that projects away from the cooling chamber 106. Each of the extendable tubes 112 has an extended position 120 when filled with the cooling fluid 110 and a retracted position 122 when emptied of the cooling fluid 110.

Another step 506 provides the pump system 300 for urging the cooling fluid 110 from the cooling chamber 106 into the plurality of extendable tubes 112. The pump system 300 includes an electronic pump control system 400 that is interfaced with a temperature sensor 402 that monitors at step 508 the temperature of the heat-generating component 102.

In operation, the method includes a step 514 of pumping the cooling fluid 110 from the cooling chamber 106 into the extendable tubes 112 when the temperature sensor 402 reports a temperature that is greater than a predetermined high temperature threshold, as determined at block 510. In contrast, cooling fluid 110 is allowed to flow out of the extendable tubes 112 at step 516 when the temperature sensor 402 reports at block 512 a temperature that is less than a predetermined low temperature threshold.

As shown assembled in FIG. 9 and discussed above, a heat sink method and apparatus is disclosed that facilitates improved heat transfer away from a heat-generating component, such as an IC chip, thereby allowing the IC chip to operate more reliably and efficiently than IC chips cooled by conventional methods. It should be noted that the orientation of the apparatus in the drawings and in any positional terms such as above and below are illustrative terms to show the relative configuration of components in the apparatus and are not limiting of scope. For example, the apparatus could be inverted or rotated at any angle with respect to the embodiments depicted herein.

That is, while the present invention has been illustrated by a description of various embodiments and while these embodiments have been described in considerable detail, it is not the intention of the Applicants to restrict, or, in any way limit the scope of the appended claims to such detail. The invention in its broader aspects is therefore not limited to the specific details, representative apparatus and method, and illustrative example shown and described. Accordingly, departures may be made from such details without departing from the spirit or scope of Applicants' general inventive concept.

What is claimed is:

1. An apparatus, comprising:
  a heat sink configured to be coupled to a heat-generating component, said heat sink including a cooling chamber containing a cooling fluid, said cooling chamber having a heat conducting wall configured to be thermally coupled to said heat-generating component, and said cooling fluid in a liquid state over a desired range of operating temperatures to conduct heat away from said heat-generating component;
  a plurality of extendable tubes attached to said heat sink in parallel, each of said extendable tubes having a port end that opens into said cooling chamber and a sealed end that projects away from said cooling chamber, each of said extendable tubes extending in about a same direction to an extended position when filled with said cooling fluid and retracting in about a same direction to a retracted position when emptied of said cooling fluid;
  at least one baffle dividing said cooling chamber into a plurality of compartments, wherein each of said compartments is associated with a different group of said plurality of extendable tubes, wherein a first group of extendable tubes includes at least three extendable tubes of the plurality of extendable tubes; and
  a pump system located within said heat sink, the pump system including one or more solenoid pumps in fluidic communication with each of said compartments to selectively direct said cooling fluid from at least one of said compartments to said first group of extendable tubes associated with said compartment to extend said extendable tubes of the first group to the extended position while selectively leaving at least one other group of extendable tubes associated with another compartment of said plurality of compartments in the retracted position.

2. The apparatus of claim 1, further including an electronic pump control system interfaced with at least one temperature sensor that monitors the temperature of said heat-generating component, wherein said heat-generating component is part of a microprocessor.

3. The apparatus of claim 2, wherein said electronic pump control system includes a micro-controller for activating the pump system to urge cooling fluid into at least one of said groups of extendable tubes to force the at least one group of extendable tubes in the extended position when said at least one temperature sensor reports at least one temperature measurement above a threshold.

4. The apparatus of claim 3, wherein said micro-controller is embedded in said heat sink.

5. The apparatus of claim 2, wherein said at least one temperature sensor is embedded in said heat conducting wall.

6. The apparatus of claim 1, wherein the plurality of extendable tubes are located on a side wall of the cooling chamber, and wherein said cooling fluid is a liquid metal.

7. The apparatus of claim 1, wherein said cooling fluid is selectively directed into groups of said plurality of extendable tubes, wherein said plurality of extendable tubes extend in a same direction relative to said heat-generating component.

8. The apparatus of claim 1, wherein each of said extendable tubes comprises a bellows having a longitudinal axis along which said bellows extends when filled with said cooling fluid and retracts when emptied of said cooling fluid, wherein said bellows are located near a base section of each of said extendable tubes.

9. The apparatus of claim 8, wherein said bellows is cylindrical.

10. The apparatus of claim 1, wherein each of said extendable tubes includes a section adapted to carry radial cooling fins.

11. The apparatus of claim 1, wherein the one or more said solenoid pumps comprise a coil winding over a tubular liner that defines a solenoid core volume and a core plunger made of magnetic material, wherein said core plunger has a coil winding energized position substantially inside said solenoid core and a coil winding de-energized position substantially outside said solenoid core volume.

12. The apparatus of claim 11, wherein said tubular liner is made of a material that is resistant to damage from both temperature and composition of said cooling fluid.

13. The apparatus of claim 11, wherein said solenoid core volume is dimensioned to contain a volume of cooling fluid equal to an amount of cooling fluid to maintain said extendable tubes in the extended position when said coil winding is energized and said core plunger takes up said solenoid core volume.

14. The apparatus of claim 1, wherein the plurality of extendable tubes are located on a side wall of the cooling chamber, and wherein each of said extendable tubes has the port end with a single opening into said cooling chamber.

15. An apparatus, comprising:
  a heat sink configured to be coupled to a heat-generating component, said heat sink including a cooling chamber containing a liquid metal, said cooling chamber having a heat conducting wall configured to be thermally coupled to said heat-generating component, wherein said liquid metal is in a liquid state over a desired range of operating temperatures to conduct heat away from said heat-generating component;

a plurality of extendable tubes attached to said heat sink in parallel, each of said extendable tubes having a port end that opens into said cooling chamber and a sealed end that projects away from said cooling chamber, each of said extendable tubes extending in about a same direction to an extended position when filled with liquid metal from said cooling chamber and retracting in about a same direction to a retracted position when emptied of said liquid metal;

at least one baffle dividing said cooling chamber into a plurality of compartments, wherein each of said compartments is associated with a different group of said plurality of extendable tubes, wherein a first group of extendable tubes includes at least three extendable tubes of the plurality of extendable tubes; and a pump system located within said heat sink, the pump system including one or more solenoid pumps in fluidic communication with each of said compartments to selectively direct said liquid metal from at least one of said compartments to said first group of extendable tubes associated with said compartment to extend said extendable tubes of the first group to the extended position while selectively leaving at least one other group of extendable tubes associated with another compartment of said plurality of compartments in the retracted position.

16. The apparatus of claim 15, further including an electronic pump control system interfaced with at least one temperature sensor embedded in said heat conducting wall.

17. The apparatus of claim 16, wherein said electronic pump control system includes a micro-controller embedded in said heat sink for activating the pump system to urge said liquid metal into at least one of said groups of extendable tubes to force the at least one group of extendable tubes in the extended position when said at least one temperature sensor reports at least one temperature measurement above a threshold.

18. The apparatus of claim 15, wherein the plurality of extendable tubes are located on a side wall of the cooling chamber, and wherein said liquid metal is selectively directed into groups of said plurality of extendable tubes.

19. The apparatus of claim 15, wherein each of said extendable tubes comprises a bellows having a longitudinal axis along which said bellows extends when filled with said liquid metal and retracts when emptied of said liquid metal, wherein said bellows are located near a base section of each of said extendable tubes.

20. The apparatus of claim 15, wherein each of said extendable tubes includes a section adapted to carry radial cooling fins.

21. The apparatus of claim 15, wherein the one or more solenoid pumps comprise a coil winding over a tubular liner that defines a solenoid core volume and a core plunger made of magnetic material, wherein said core plunger has a coil winding energized position substantially inside said solenoid core and a coil winding de-energized position substantially outside said solenoid core volume.

22. The apparatus of claim 21, wherein said tubular liner is made of a material that is resistant to damage from both temperature and composition of said liquid metal.

23. The apparatus of claim 21, wherein said solenoid core volume is dimensioned to contain a volume of liquid metal equal to an amount of liquid metal needed to maintain said extendable tubes into the extended position when said coil winding is energized and said core plunger takes up said solenoid core volume.

24. A method of cooling a heat-generating component, said method comprising:

providing a heat sink having a cooling chamber containing a cooling fluid, said cooling chamber having a heat conducting wall configured to be thermally coupled to said heat-generating component, and said cooling fluid is in a liquid state over a desired range of operating temperatures to conduct heat away from said heat-generating component;

providing a plurality of extendable tubes attached to said heat sink in parallel, each of said extendable tubes having a port end that opens into said cooling chamber and a sealed end that projects away from said cooling chamber, each of said extendable tubes extending in about a same direction to an extended position when filled with said cooling fluid and retracting in about a same direction to a retracted position when emptied of said cooling fluid;

providing at least one baffle dividing said cooling chamber into a plurality of compartments, wherein each of said compartments is associated with a different group of said plurality of extendable tubes, wherein a first group of extendable tubes includes at least three extendable tubes of the plurality of extendable tubes; and providing a pump system located within said heat sink, the pump system including one or more solenoid pumps in fluidic communication with each of said compartments to selectively direct said cooling fluid from at least one of said compartments to said first group of extendable tubes associated with said compartment to extend said extendable tubes of the first group to the extended position while selectively leaving at least one other group of extendable tubes associated with another compartment of said plurality of compartments in the retracted position, said pump system including an electronic pump control system interfaced with at least one temperature sensor that monitors the temperature of said heat-generating component.

25. The method of claim 24, wherein said pump system is configured to pump said cooling fluid from at least one of said compartments into said first group of extendable tubes when said at least one temperature sensor reports a temperature that is greater than a temperature threshold.

26. An apparatus, comprising:

a heat sink configured to be coupled to a heat-generating component, said heat sink including a cooling chamber containing a liquid metal, said cooling chamber having a heat conducting wall configured to be thermally coupled to said heat-generating component, and said liquid metal is in a liquid state over a desired range of operating temperatures to conduct heat away from said heat-generating component;

a plurality of extendable tubes attached to said heat sink in parallel, each of said extendable tubes having a port end that opens into said cooling chamber and a sealed end that projects away from said cooling chamber, each of said extendable tubes extending in about a same direction to an extended position when filled with liquid metal from said cooling chamber and retracting in about a same direction to a retracted position when emptied of said liquid metal;

at least one baffle dividing said cooling chamber into a plurality of compartments, wherein each of said compartments is associated with a different group of said plurality of extendable tubes, wherein a first group of extendable tubes includes at least three extendable tubes of the plurality of extendable tubes;

a pump system located within said heat sink, the pump system including one or more solenoid pumps in fluidic communication with each of said compartments to selectively direct said liquid metal from at least one of said compartments to said first group of extendable tubes associated with said compartment to extend said extendable tubes of the first group to the extended position while selectively leaving at least one other group of extendable tubes associated with another compartment of said plurality of compartments in the retracted position; and an electronic pump control system that includes a microcontroller in communication with at least one temperature sensor for activating said pump system to urge said liquid metal into at least one of said groups of extendable tubes to force the at least one group of extendable tubes in the extended position when said at least one temperature sensor reports at least one temperature measurement above a threshold.

\* \* \* \* \*